(12) United States Patent
Cho

(10) Patent No.: US 9,666,657 B2
(45) Date of Patent: May 30, 2017

(54) DISPLAY DEVICE HAVING STATIC ELECTRICITY SHIELDING MEMBER

(71) Applicant: Samsung Display Co., Ltd., Yongin-si, Gyeonggi-Do (KR)

(72) Inventor: Kyong-Hun Cho, Hwaseong-si (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 0 days.

(21) Appl. No.: 14/792,265

(22) Filed: Jul. 6, 2015

(65) Prior Publication Data

US 2016/0197132 A1    Jul. 7, 2016

(30) Foreign Application Priority Data

Jan. 5, 2015    (KR) .................. 10-2015-0000692

(51) Int. Cl.
| | | |
|---|---|---|
| *H01L 23/60* | (2006.01) | |
| *H01L 27/32* | (2006.01) | |
| *H01L 27/02* | (2006.01) | |
| *H01L 23/522* | (2006.01) | |

(52) U.S. Cl.
CPC ...... *H01L 27/3272* (2013.01); *H01L 23/5225* (2013.01); *H01L 23/60* (2013.01); *H01L 27/0248* (2013.01); *H01L 27/3265* (2013.01); *H01L 27/3276* (2013.01)

(58) Field of Classification Search
CPC . H01L 23/5225; H01L 23/60; H01L 27/0248; H01L 27/3272
See application file for complete search history.

(56) References Cited

U.S. PATENT DOCUMENTS

| | | | |
|---|---|---|---|
| 7,864,254 B2 | 1/2011 | Kim et al. | |
| 7,903,187 B2 | 3/2011 | Shin et al. | |
| 8,637,867 B2 | 1/2014 | Choi | |
| 8,895,988 B2 | 11/2014 | Choi | |
| 2014/0030831 A1* | 1/2014 | Wei | H01L 27/1255 438/29 |
| 2015/0206931 A1* | 7/2015 | Choi | H01L 27/3272 257/72 |
| 2016/0163780 A1* | 6/2016 | Park | H01L 27/3248 257/40 |

FOREIGN PATENT DOCUMENTS

| | | |
|---|---|---|
| KR | 10-0729046 B1 | 6/2007 |
| KR | 10-2008-0061067 A | 7/2008 |
| KR | 10-2009-0053385 A | 5/2009 |

* cited by examiner

*Primary Examiner* — Eduardo A Rodela
*Assistant Examiner* — Christopher M Roland
(74) *Attorney, Agent, or Firm* — Robert E. Bushnell, Esq.

(57) ABSTRACT

A display device includes: a substrate; a static electricity shielding member formed on the substrate; a scan line formed on the substrate and transferring a scan signal; a data line and a driving voltage line intersecting the scan line, being insulated therefrom and each transferring a data signal and a driving voltage; a thin film transistor formed on the static electricity shielding member; a first sacrifice electrode connected to the static electricity shielding member; and a second sacrifice electrode positioned under the first sacrifice electrode to form a sacrifice capacitor.

20 Claims, 5 Drawing Sheets

DISPLAY DEVICE HAVING STATIC ELECTRICITY SHIELDING MEMBER

CLAIM OF PRIORITY

This application makes reference to, incorporates the same herein, and claims all benefits accruing under 35 U.S.C. §119 from an application earlier filed in the Korean Intellectual Property Office on 5 Jan. 2015 and there duly assigned Serial No. 10-2015-0000692.

BACKGROUND OF THE INVENTION

1. Field of Disclosure

The present invention relates to a display device, and more specifically, to a display device preventing static electricity from disadvantageously affecting a switching element of the display device.

2. Description of the Related Art

An organic light emitting diode display device generally includes a cathode, an anode and an organic emission layer disposed therebetween and forms excitons by combining electrons injected from the cathode with holes injected from the anode at the organic emission layer and emits light by allowing the excitons to emit energy.

The organic light emitting diode display device generally includes a plurality of pixels including an organic light emitting diode which includes a cathode, an anode, and an organic emission layer, and each pixel is provided with a plurality of transistors for driving the organic light emitting diode and a capacitor.

A thickness of an insulating layer which insulates metals from one and another such as a scan line and a data line forming the transistor is typically thin, and has a thickness of 1000 Å. Therefore the insulating layer is vulnerable to static elasticity. Further, when each driving circuit has points which are vulnerable to static electricity, the static electricity is continuously generated at the points which are vulnerable to the static electricity. That is, since a separate pattern is not formed under the scan line, when the static electricity is introduced into the scan line, an outlet through which the static electricity is discharged is not present. Therefore, the static electricity is generated at a transistor adjacent to the scan line. In this case, the scan line is connected to the semiconductor layer and thus a short-circuit occurs. Due to the short-circuit, dark points occur in a pixel.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a display device having an advantage of guiding static electricity to a place where the static electricity does not affect a switching element.

An exemplary embodiment of the present invention provides a display device including: a substrate; a static electricity shielding member formed on the substrate; a scan line formed on the substrate and transferring a scan signal; a data line and a driving voltage line intersecting the scan line, being insulated therefrom and the data line transferring a data signal and the driving voltage line transferring a driving voltage; a thin film transistor formed on the static electricity shielding member; a first sacrifice electrode connected to the static electricity shielding member; and a second sacrifice electrode positioned under the first sacrifice electrode to form a sacrifice capacitor together with the first sacrifice electrode.

The thin film transistor may include: a semiconductor layer formed to overlap the static electricity shielding member; a gate electrode formed on the semiconductor layer and extending from the scan line, and a source electrode and a drain electrode formed on the gate electrode and connected to the semiconductor layer.

The static electricity shielding member may be formed to be larger than the semiconductor layer.

The first sacrifice electrode may be formed on the same layer as the gate electrode.

The first sacrifice electrode may be made of the same material as the gate electrode.

The second sacrifice electrode may be formed on the same layer as the semiconductor layer.

The second sacrifice electrode may be made of the same material as the semiconductor layer.

The static electricity shielding member may be made of metal, polysilicon, or oxide semiconductor.

The semiconductor layer may be made of polysilicon or oxide semiconductor.

The display device may further include: a buffer layer covering the static electricity shielding member, while being positioned between the static electricity shielding member and the semiconductor layer; a gate insulating layer covering the semiconductor layer, while being positioned between the semiconductor layer and the gate electrode; and an interlayer insulating layer covering the gate electrode, while being positioned between the gate electrode and the source electrode and drain electrode.

The buffer layer and the gate insulating layer may include a first contact hole through which the static electricity shielding member and the first sacrifice electrode are connected to each other.

The display device may further include a ground electrode connected to the second sacrifice electrode.

The gate insulating layer may include a second contact hole through which the second sacrifice electrode and the ground electrode are connected to each other.

The ground electrode may be formed on the same layer as the gate electrode.

The ground electrode may be made of the same material as the gate electrode.

The ground electrode may be applied with a constant potential voltage.

The display device may further include an organic light emitting diode connected to the thin film transistor.

In the above-mentioned technical problems of the present invention, other features and advantages of the present invention will be described below or will be clearly understood to those skilled in the art from the technology and description.

According to an exemplary embodiment of the present invention, the following effects may be obtained.

According to an exemplary embodiment of the present invention, the static electricity shielding member positioned under the semiconductor layer and the parasitic capacitor Cst2 connected to the static electricity shielding member are formed and thus the outside static electricity is previously transferred to the parasitic capacitor Cst along the static electricity shielding member before the semiconductor layer and the gate electrode are short-circuited from each other, thereby protecting the transistor.

Further, other features and advantages may be newly understood based on the exemplary embodiments of the present invention.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
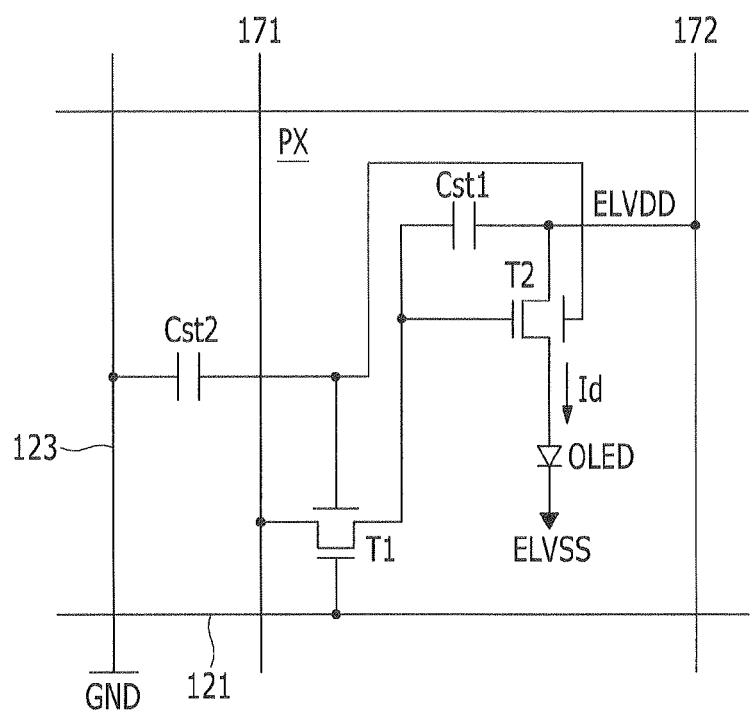
FIG. 1 is an equivalent circuit diagram of a pixel of an organic light emitting diode display device according to an exemplary embodiment of the present invention.

Hereinafter, several exemplary embodiments of the present invention will be described in detail with reference to the accompanying drawings so that those skilled in the art to which the present invention pertains may easily practice the present invention. The present invention may be implemented in various different forms and is not limited to exemplary embodiments provided herein.

Portions unrelated to the description will be omitted in order to obviously describe the present invention, and similar components will be denoted by the same reference numerals throughout the present specification.

In addition, since sizes and thicknesses of the respective components shown in the accompanying drawings are arbitrarily shown for convenience of explanation, the present invention is not necessarily limited to contents shown in the accompanying drawings.

In the drawings, the thickness of layers, films, panels, regions, etc., are exaggerated for clarity. In addition, in the accompanying drawings, thicknesses of some of layers and regions have been exaggerated. It will be understood that when an element such as a layer, film, region, or substrate is referred to as being "on" another element, it can be directly on the other element or intervening elements may also be present.

In addition, unless explicitly described to the contrary, the word "comprise" and variations such as "comprises" or "comprising", will be understood to imply the inclusion of stated elements but not the exclusion of any other elements.

Further, a display device according to an exemplary embodiment of the present invention includes an organic light emitting diode display device, a liquid crystal display device, and the like.

Hereinafter, an organic light emitting diode display device according to an exemplary embodiment of the present invention will be described with reference to FIGS. 1 through 4.

FIG. 1 is an equivalent circuit diagram of a pixel of an organic light emitting diode display device according to an exemplary embodiment of the present invention, in which the organic light emitting diode display device is an active matrix (AM) type organic light emitting diode display device having a 2Tr 2Cap structure in which two transistors (TFTs) and two capacitors are included in one pixel.

As illustrated in FIG. 1, the organic light emitting device according to the exemplary embodiment of the present invention includes a plurality of signal lines 121, 123, 171, and 172 and a plurality of pixels PXs which are connected to the signal lines and are arranged in substantially a matrix form.

The signal line includes a plurality of can lines 121 which transfer scan signals (or gate signals), a plurality of data lines 171 which transfer data signals, a plurality of driving voltage lines 172 which transfer a driving voltage ELVDD, and a constant potential voltage line 123 which transfers a constant potential voltage. The scan lines 121 extend in substantially a row direction and are substantially parallel with each other. The data line 171, the constant potential voltage line 123, and the driving voltage line 172 extend in substantially a column direction and are substantially parallel with each other. Each pixel PX includes a switching transistor T1, a driving transistor T2, a storage capacitor Cst1, a sacrifice capacitor Cst2, and an organic, light emitting, diode (OLED).

The switching transistor T1 includes a control terminal, an input terminal, and an output terminal, in which the control terminal is connected to the scan line 121, the input terminal is connected to the data line 171, and the output terminal is connected to the driving transistor T2. The switching transistor T1 transfers the data signal applied to the data line 171 to the driving transistor T2 in response to the scan signal applied to the scan line 121.

The driving transistor T2 also has a control terminal, an input terminal, and an output terminal, in which the control terminal is connected to the switching transistor T1, the input terminal is connected to the driving voltage line 172, and the output terminal is connected to the organic light emitting diode (OLED). The driving transistor T2 transfers an output current Id of which the magnitude varies in dependence upon a voltage applied between the control terminal and the output terminal.

The storage capacitor Cst1 is connected between the control terminal and the input terminal of the driving transistor T2. The storage capacitor Cst1 charges the data signal applied to the control terminal of the driving transistor T2 and maintains the charged data signal even after the switching transistor T1 is turned off.

The sacrifice capacitor Cst2 is connected between the first sacrifice electrode connected to the constant potential voltage line 123 and the second sacrifice electrode connected to the static electricity shielding member which is positioned under the semiconductor layer of the switching transistor T1 and the driving transistor T2. The sacrifice capacitor Cst2 prevents static electricity from the outside from being transferred to the switching transistor T1 and the driving transistor T2.

The organic light emitting diode (OLED) has an anode connected to the output terminal of the driving transistor T2 and a cathode connected to a common voltage ELVSS. The organic light emitting diode (OLED) emits light of which the intensity varies depending on the output current Id of the driving transistor T2 to display an image.

The switching transistor T1 and the driving transistor T2 may be an n-channel field effect transistor (FET) or a p-channel field effect transistor. Further, a connection relationship of the transistors T1 and T2, the storage capacitor Cst1, and the organic light emitting diode (OLED) may be changed.

Next, a detailed structure of the pixel of the organic light emitting diode display device illustrated in FIG. 1 will be described in detail with reference to FIGS. 2 through 4, along with FIG. 1.

Figure 2:
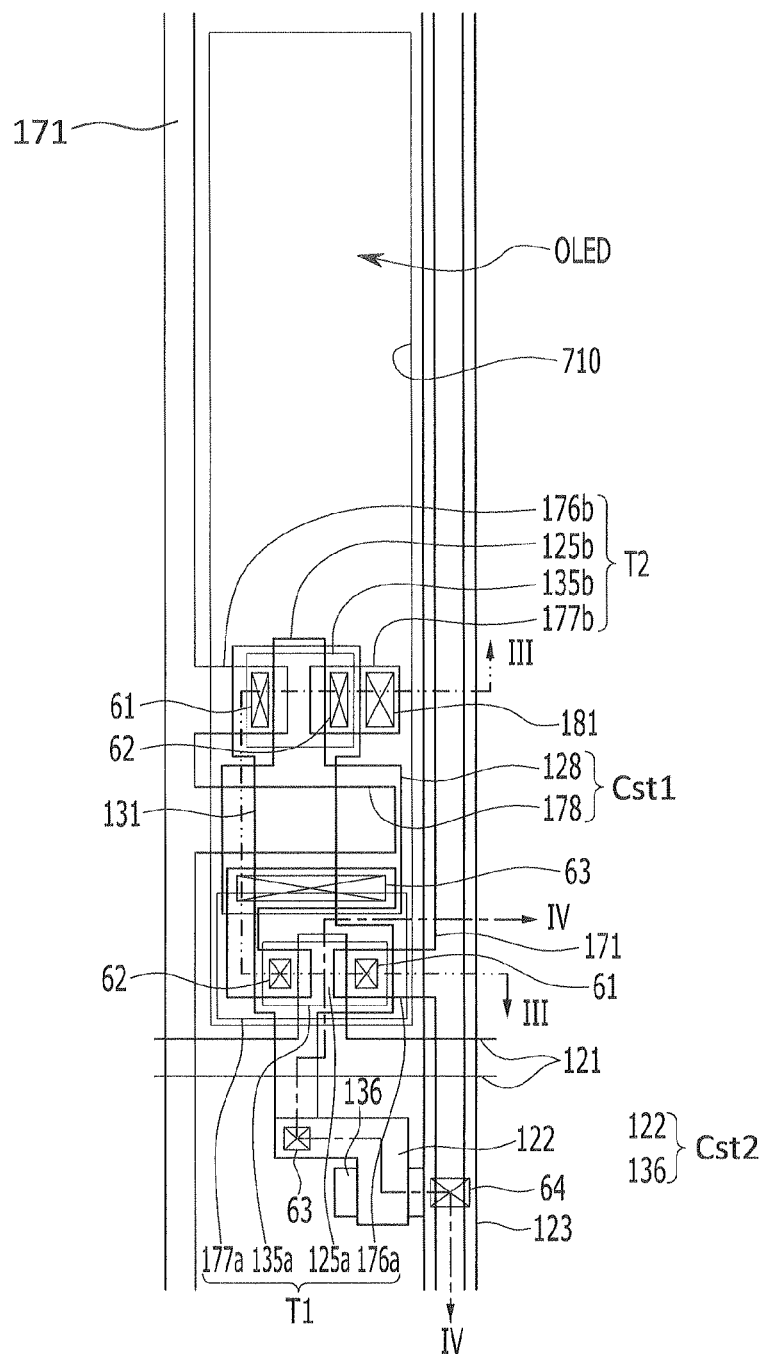
FIG. 2 is a layout view of one pixel of the organic light emitting diode display device according to the exemplary embodiment of the present invention.
Figure 3:
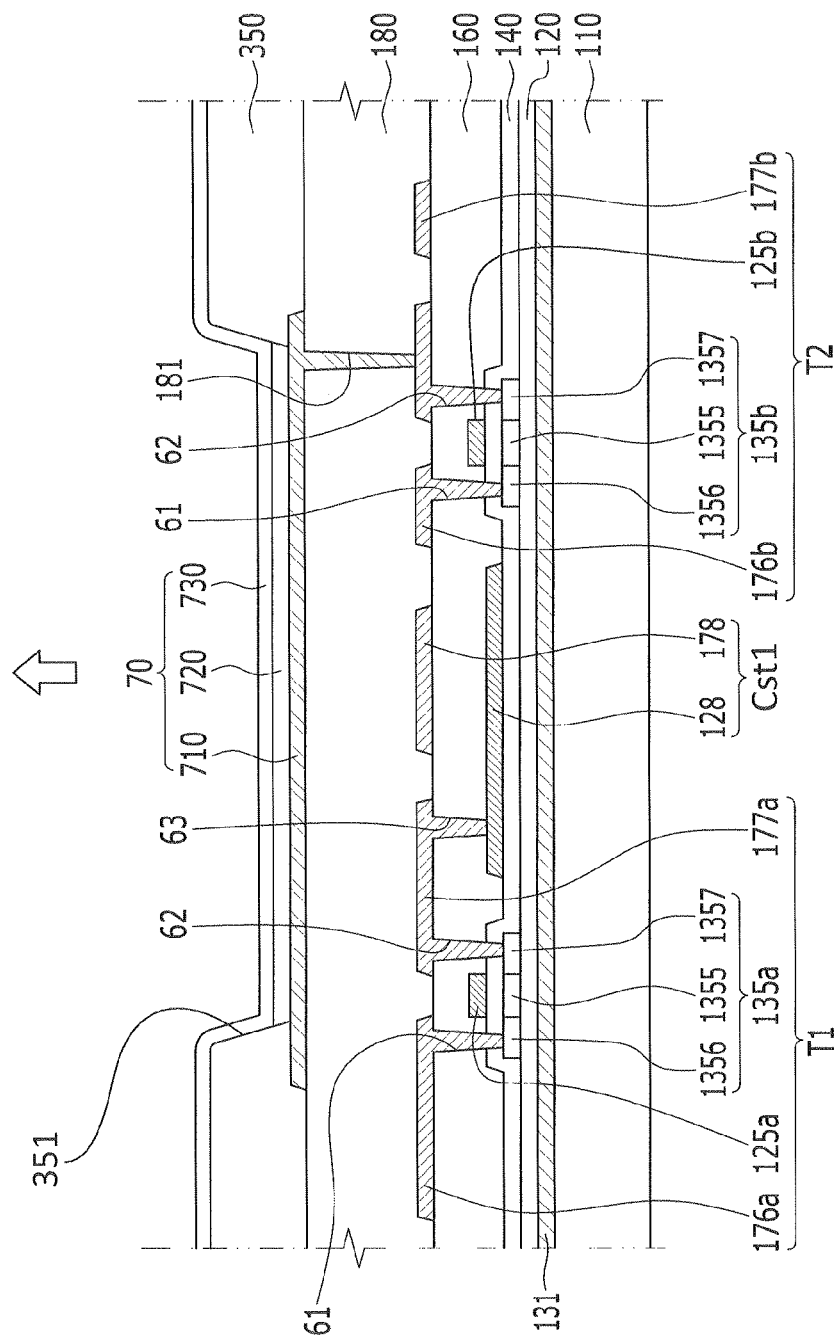
FIG. 3 is a cross-sectional view taken along the line III-III of FIG. 2.
Figure 4:
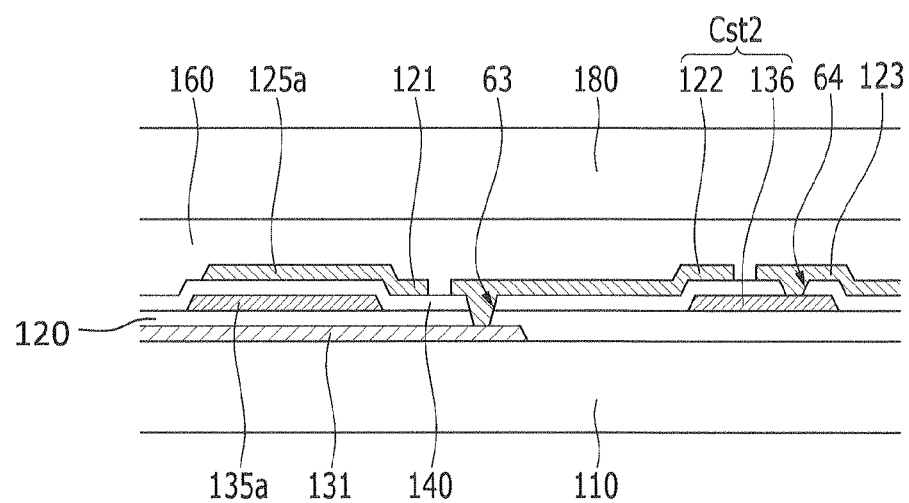
FIG. 4 is a cross-sectional view taken along the line IV-IV of FIG. 2.

FIG. 2 is a layout view of one pixel of the organic light emitting diode display device according to the exemplary embodiment of the present invention, FIG. 3 is a cross-sectional view taken along the line III-III of FIG. 2, and FIG. 4 is a cross-sectional view taken along the line IV-IV of FIG. 2.

In reference to FIGS. 2 through 4, the organic light emitting diode display device according to the exemplary embodiment of the present invention includes the static electricity shielding member 131, the switching transistor T1, the driving transistor T2, and the sacrifice capacitor Cst2.

The substrate 110 may be an insulating flexible substrate which is made of glass, quartz, ceramic, plastic, or the like.

The static electricity shielding member 131 is formed on the substrate 110. The static electricity shielding member 131 is formed to overlap the switching transistor T1 and the driving transistor T2.

The static electricity shielding member 131 prevents static electricity introduced from the outside of the substrate 110 from being introduced into the switching transistor T1 and the driving transistor T2.

The static electricity shielding member 131 is formed to be larger than a switching semiconductor layer 135a and a driving semiconductor layer 135b to be described below to prevent the static electricity from being introduced into the switching semiconductor layer 135a and the driving semiconductor layer 135b.

In this case, the static electricity shielding member 131 may be made of metal, polysilicon, or oxide semiconductor.

A buffer layer 120 which covers the static electricity shielding member 131 is formed on the substrate 110. The buffer layer 120 may have a single layer structure made of silicon nitride (SiNx) or a double layer structure in which silicon nitride (SiNx) and silicon oxide $SiO_2$ are stacked. The buffer layer 120 serves to planarize a surface while preventing permeation of unnecessary components, such as impurities and moisture.

The switching semiconductor layer 135a and the driving semiconductor layer 135b are formed on the buffer layer 120, being spaced apart from each other. Further, the static electricity shielding member 131 enclosing the switching semiconductor layer 135a is formed on the buffer layer 120. In FIG. 2, the static electricity shielding member 131 encloses the switching semiconductor layer 135a in a quadrangular shape but is not limited thereto, and therefore, the static electricity shielding member may enclose the switching semiconductor layer 135a in various shapes.

The switching semiconductor layer 135a, the driving semiconductor layer 135b, and a second sacrifice electrode 136 are formed on the buffer layer 120, being spaced apart from one another.

The semiconductor layer 135a and 135b and the second sacrifice electrode 136 may be made of polysilicon or oxide semiconductor, in which the oxide semiconductor may include any one of oxide which is based on titanium (Ti), hafnium (Hf), zirconium (Zr), aluminum (Al), tantalum (Ta), germanium (Ge), zinc (Zn), gallium (Ga), tin (Sn), or indium (In), and any one of zinc oxide (ZnO), indium-gallium-zinc oxide (InGaZnO4), indium-zinc oxide (Zn—In—O), zinc-tin oxide (Zn—Sn—O), indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), hafnium-indium-zinc oxide (Hf—In—Zn—O), all of which are composite oxides thereof. When the semiconductor layers 135a and 135b are made of the oxide semiconductor, a separate passivation layer may be added to protect the oxide semiconductor which is vulnerable to external environments, such as high temperature.

The semiconductor layers 135a and 135b include a channel region which is not doped with impurities and a source region and a drain region formed by doping both sides of the channel region with impurities. Here, these impurities may be changed depending on a kind of transistor and may be N-type or P-type impurities.

The switching semiconductor layer 135a and the driving semiconductor layer 135b are each divided into a channel region 1355 and a source region 1356 and a drain region 1357 which are each formed at both sides of a channel region 1355. The channel region 1355 of the switching semiconductor layer 135a and the driving semiconductor layer 135b may include polysilicon which is not doped with impurity, that is, intrinsic semiconductor and the source region 1356 and the drain region 1357 of the switching semiconductor layer 135a and the driving semiconductor layer 135b may include polysilicon which is doped with conductive impurity, that is, impurity semiconductor.

The gate insulating layer 140 is formed on the switching semiconductor layer 135a, the driving semiconductor layer 135b, and the second sacrifice electrode 136. The gate insulating layer 140 may be a single layer or a plurality of layers including at least one of silicon nitride and silicon oxide.

The scan line 121, a driving gate electrode 125b, a first storage plate of electricity 128, a first sacrifice electrode 122, and a ground electrode GND/123 are formed on the gate insulating layer 140. The scan line 121 extends in a horizontal direction to transfer the scan signal and includes a switching gate electrode 125a which protrudes from the scan line 121 to the switching semiconductor layer 135a. The driving gate electrode 125b protrudes from the first storage plate of electricity 128 to the semiconductor layer 135b. The switching gate electrode 125a and the driving gate electrode 125b each overlap the channel region 1355.

The first sacrifice electrode 122 is arranged on the buffer layer 120 and the gate insulating layer 140 and is thus electrically connected to the static electricity shielding member 131 through a first contact hole 63 through which the static electricity shielding, member 131 is exposed.

The gate insulating layer 140 includes a second contact hole 64 through which the second sacrifice electrode 136 is exposed.

The ground electrode GND/123 is connected to the second sacrifice electrode 136 through the second contact hole 64 and is applied with a constant potential voltage. The exemplary embodiment of the present invention describes that the second sacrifice electrode 136 is applied with the constant potential voltage through the ground electrode GND/123 that is formed on a different layer than the second sacrifice electrode 136, but is not limited thereto, and therefore, the constant potential voltage may be directly applied to the second sacrifice electrode 136.

The first sacrifice electrode 122 forms the sacrifice capacitor Cst2, along with the second sacrifice electrode 136.

The static electricity introduced from the outside of the substrate 110 into the semiconductor layers 135a and 135b is first introduced to the static electricity shielding member 131 prior to being introduced into the semiconductor layers 135a and 135b, and is transferred to the sacrifice capacitor Cst2 through the static electricity shielding member 131.

In the display device according to Comparative Example of the present invention which does not include the static electricity shielding member 131, the outside static electricity is introduced into the gate insulating layer 140, such that the gate insulating layer formed on the semiconductor layers 135a and 135b may become cracked, and a short-circuit between the semiconductor layers 135a and 135b and the gate electrodes 125a and 125b respectively may occur.

In the display device according to the exemplary embodiment of the present invention, the static electricity shielding member 131 positioned under the semiconductor layers 135a and 135b and the parasitic capacitor Cst2 connected to the static electricity shielding member 131 are formed and thus the outside static electricity is initially transferred to the parasitic capacitor Cst2 via the static elasticity shielding member 131 before the semiconductor layer 135a and the gate electrode 125a are short-circuited together, thereby protecting the transistor.

In this case, the scan line 121, the driving gate electrode 125b, the first storage plate of electricity 128, the first sacrifice electrode 122, and the ground electrode GND/123 may be made of the same material and may be formed on the same layer. The scan line 121, the driving gate electrode 125b, the first storage plate of electricity 128, the first sacrifice electrode 122, and the ground electrode GND/123 may be a single layer made of aluminum (Al), copper (Cu), silver (Ag), molybdenum (Mo), chromium (Cr), titanium (Ti), tantalum (Ta), indium-tin-oxide (ITO), indium-zinc-oxide (IZ0), an alloy thereof or the like or a multilayer made of a combination thereof, but the exemplary embodiment of the present invention is not limited to the above example.

An interlayer insulating layer 160 is formed on the scan line 121, the driving gate electrode 125b, the first storage capacitor 128, the first sacrifice electrode 122, and the ground electrode GND/123. Similar to the gate insulating, layer 140, the interlayer insulating layer 160 may be made of silicon nitride, silicon oxide, or the like.

The source contact hole 61 and the drain contact hole 62 through which the source region 1356 and the drain region 1357 are each exposed are formed on the interlayer insulating layer 160, and the gate insulating layer 140 and the storage contact hole 63 through which a portion of the first storage plate of electricity 128 is exposed is formed.

The data line 171 having a switching source electrode 176a, a driving voltage line 172 having a driving source electrode 176b, a second storage plate of electricity 178, a switching drain electrode 177a and a driving drain electrode 177b connected to the first storage plate of electricity 128 are formed on the interlayer insulating layer 160.

The data lines 171 transfer the data signal and extends in a vertical direction to intersect the gate lines 121. The driving voltage line 172 transfers the driving voltage and extends in the same direction as the data line 171, being separated from the data line 171.

The switching source electrode 176a protrudes from the data line 171 toward the switching semiconductor layer 135a, and the driving source electrode 176b protrudes from the driving voltage line 172 toward the driving semiconductor layer 135b. The switching source electrode 176a and the driving source electrode 176b are each connected to the source region 1356 through the source contact hole 61. The switching drain elect rode 177a faces the switching source electrode 176a, the driving drain electrode 177b faces the driving source electrode 176b, and the switching drain electrode 177a and the driving drain electrode 177b are each connected to the drain region 1357 through the drain contact hole 62.

The switching drain electrode 177a extends to be electrically connected to the first storage plate of electricity 128 and the driving gate electrode 125b through the contact hole 63 which is formed in the interlayer insulating layer 160.

The second storage plate of electricity 178 protrudes from the driving voltage line 171 to overlap the first storage plate of electricity 128. Therefore, the first storage plate of electricity 128 and the second storage plate of electricity 178 form the storage capacitor Cst1 using the interlayer insulating layer 160 as a dielectric material.

The switching semiconductor layer 135a, the switching gate electrode 125a, the switching source electrode 176a, and the switching drain electrode 177a form the switching transistor T1, and the driving semiconductor layer 135b, the driving gate electrode 125a, the driving source electrode 176b, and the driving drain electrode 177b form the driving transistor T2.

A passivation layer 180 is formed on the switching source electrode 176a, the driving source electrode 176b, the switching drain electrode 177a, and the driving drain electrode 177b.

A pixel electrode 710 is formed on the passivation layer 180 and the pixel electrode 710 may be made of transparent conductive materials such as indium tin oxide (ITO), indium zinc oxide (IZO), zinc oxide (ZnO) or indium oxide (In$_2$O$_3$) or reflective metals such as lithium (Li), calcium (Ca), lithium fluoride/calcium (LiF/Ca), lithium fluoride/aluminum (LiF/Al), aluminum (Al), silver (Ag), magnesium (Mg), or gold (Au). The pixel electrode 710 is electrically connected to the driving drain electrode 177b of the driving transistor T1 through a contact hole 181 formed on the interlayer insulating layer 160 and thus becomes an anode of an organic light emitting diode 70.

The pixel defined layer 350 is formed on the passivation layer 180 and an edge portion of the pixel electrode 710. The pixel defined layer 350 has an opening 351 through which the pixel electrode 710 is exposed. The pixel defined layer 350 may be made of resin such as polyacrylates or polyimides, silica-based inorganic materials, and the like.

An organic light emitting layer 720 is formed on the opening 351 of the pixel defined layer 350. The organic light emitting layer is formed of a plurality of layers which include at least one of a light emitting layer, a hole-injection layer (HIL), a hole-transporting layer (HTL), an electron-transporting layer (ETL), and an electron-injection layer (EIL). When the organic light emitting layer 720 includes both of them, the hole injection layer is disposed on the pixel electrode 710 which is the anode and the hole transport layer, the light emitting layer, the electron transport layer, and the electron injection layer may be sequentially stacked thereon.

The organic light emitting layer 720 may include a red organic light emitting layer which emits red light, a green organic light emitting layer which emits green light, and a blue organic light emitting layer which emits blue light, in which the red organic light emitting layer, the green organic light emitting layer, and the blue organic light emitting layer are each formed in a red pixel, a green pixel, and a blue pixel to implement a color image.

Further, the organic light emitting layer 720 may implement the color image by stacking the red organic light emitting layer, the green organic light emitting layer, and the blue organic light emitting layer in all of the red pixel, the green pixel, and the blue pixel and forming a red filter, a green filter, and a blue filter for each pixel. As another example, the color image may be implemented by forming a white organic light emitting layer which emits white light in all of the red pixel, the green pixel, and the blue pixel and forming the red filter, the green filter, and the blue filter for each pixel. At the time of implementing the color image using the white organic light emitting layer and the color filters, there is no need to use a deposition mask for depositing the red organic light emitting layer, the green organic light emitting layer, and the blue organic light emitting layer on each pixel, that is, the red pixel, the green pixel, and the blue pixel.

The white organic light emitting layer described in another example may be formed of a single organic light emitting layer and may be configured to emit white light by stacking the plurality of organic light emitting layers. For example, the white organic light emitting layer may also include a configuration to emit white light by combining at least one yellow organic light emitting layer with at least one blue organic light emitting layer, a configuration to emit white light by combining at least one cyan organic light emitting layer with at least one red organic light emitting layer, and a configuration to emit white light by combining at least one magenta organic light emitting layer with at least one green organic light emitting layer, and the like.

A common electrode 730 is formed on the pixel defined layer 350 and the organic emission layer 720. The common electrode 730 may be made of transparent conductive materials such as indium tin oxide (ITO), indium zinc oxide (IZO), zinc oxide (ZnO) and indium oxide ($In_2O_3$) or reflective metals such as lithium (Li), calcium (Ca), lithium fluoride/calcium (LiF/Ca), lithium fluoride/aluminum (LiF/Al), aluminum (Al), silver (Ag), magnesium (Mg), and gold (Au). The common electrode 730 becomes a cathode of the organic light emitting diode 70. The pixel electrode 710, the organic emission layer 720, and the common electrode 730 form the organic light emitting diode 70.

Figure 5:
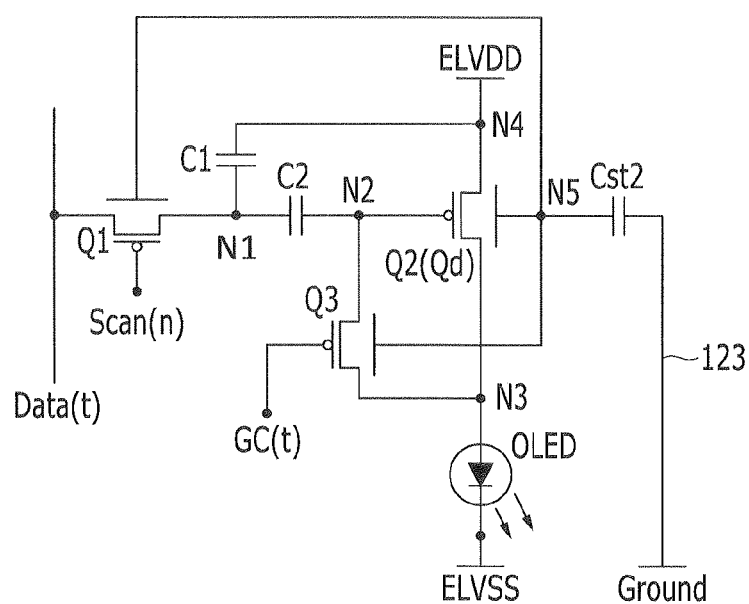
FIG. 5 is an equivalent circuit diagram of a pixel of an organic light emitting diode display device according to another exemplary embodiment of the present invention.

FIG. 5 is an equivalent circuit diagram of a pixel of an organic light emitting diode display device according to another exemplary embodiment of the present invention, in which the organic light emitting diode display device is an active matrix (AM) type organic light emitting diode display device having a 3Tr 3Cap structure in which three transistors (TFTs) and three capacitors are included in one pixel.

As illustrated in FIG. 5, a gate of the first transistor Q1 is connected to a current scan signal scan[n], the input terminal is connected to a data signal Data[t], and the output terminal is connected to a first node N1.

The gate of the driving transistor Qd which is the second transistor Q2 is connected to the second capacitor C2 at a second node N2, the input terminal is connected to a first power supply, for example, a driving voltage ELVDD at a fourth node N4, and the output terminal is connected to the anode electrode of the organic light emitting diode (OLED) and an input terminal of a third transistor Q3 at a third node N3.

The gate of the third transistor Q3 is connected a global control signal GC(t) for compensating for a threshold voltage of the driving transistor Qd, the input terminal is connected to the output terminal of the driving transistor Qd at the third node N3, and the output terminal is connected to the gate of the driving transistor Qd and the second capacitor C2 at the second node.

One terminal of a first capacitor C1 is connected to one terminal of the second capacitor C2 and an output terminal of the first transistor Q1 at the first node N1 and the other terminal thereof is connected to the first power supply required to supply a current to the organic light emitting diode at the fourth node N4, for example, the driving voltage ELVDD.

One terminal of the second capacitor C2 is connected to the output terminal of the first transistor Q1 and one terminal of the first capacitor C1 at the first node N1, and the other terminal thereof is connected to the gate of the driving transistor Qd and the output terminal of the third transistor Q3 at the second node N2.

The sacrifice capacitor Cst2 is connected between the first sacrifice electrode connected to the constant potential voltage line 123 and the second sacrifice electrode connected to the static electricity shielding member which is positioned under the semiconductor layer of the first transistor Q1, the second transistor Q2, and the third transistor Q3 at a fifth node N5. The sacrifice capacitor Cst2 prevents static electricity from the outside from being transferred to the first transistor Q1, the switching transistor Q2, and the third transistor Q3.

The anode (pixel electrode) of the organic light emitting diode (OLED) is connected to the output terminal of the driving transistor Qd and the input terminal of the third transistor Q3 at the third node N3 and the cathode (common electrode) thereof is connected to a second power supply, for example a common voltage ELVss.

The first transistor Q1 is a switching transistor which responds to a current scan signal scan[n] to transfer the data signal Data[t] to the corresponding data line and controls a light emission amount of the organic light emitting diode (OLED) to transfer the data signal Data[t].

The driving transistor Qd which is the second transistor Q2 is the driving transistor Qd which responds to the data signal (Data[t]) transferred to the gate through the first transistor Q1 to supply the driving current of the organic light emitting diode (OLED).

The third transistor Q3 is a threshold voltage compensation transistor which responds to the global control signal GC[t] to compensate for a threshold voltage of the driving transistor Qd.

The first capacitor C1 is a capacitor for storing a data signal applied to the gate of the driving transistor Qd.

The second capacitor C2 is a capacitor for controlling the threshold voltage of the driving transistor Qd.

The sacrifice capacitor Cst2 prevents the outside static electricity from being introduced into the first transistor Q1, the second transistor Q2, and the third transistor Q3.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device, comprising:
   a substrate;
   a static electricity shielding member formed on the substrate;
   a scan line formed on the substrate and transferring, a scan signal;
   a data line and a driving voltage line intersecting the scan line, being insulated therefrom and respectively transferring a data signal and a driving voltage;
   a thin film transistor formed on the static electricity shielding member;
   a first sacrifice electrode connected to the static electricity shielding member; and
   a second sacrifice electrode positioned under the first sacrifice electrode to form a sacrifice capacitor together with the first sacrifice electrode.

2. The display device of claim 1, wherein:
   the thin film transistor includes
   a semiconductor layer formed to overlap the static electricity shielding member,
   a gate electrode formed on the semiconductor layer and extending from the scan line, and
   a source electrode and a drain electrode connected to the semiconductor layer.

3. The display device of claim 2, wherein:
   the static electricity shielding member is formed to be larger than the semiconductor layer.

4. The display device of claim 2, wherein:
   the first sacrifice electrode is formed on a same layer as the gate electrode.

5. The display device of claim 4, wherein:
   the first sacrifice electrode is made of a same material as the gate electrode.

6. The display device of claim 2, wherein:
   the second sacrifice electrode is formed on a same layer as the semiconductor layer.

7. The display device of claim 6, wherein:
   the second sacrifice electrode is made a same material as the semiconductor layer.

8. The display device of claim 2 wherein:
   the static electricity shielding member is made of metal, polysilicon, or oxide semiconductor.

9. The display device of claim 2, further comprising:
   a buffer layer covering the static electricity shielding member, while being positioned between the static electricity shielding member and the semiconductor layer;
   a gate insulating layer covering the semiconductor layer, while being positioned between the semiconductor layer and the gate electrode; and
   an interlayer insulating layer covering the gate electrode, while being positioned between the gate electrode and the source electrode and drain electrode.

10. The display device of claim 9, wherein:
    the buffer layer and the gate insulating layer include a first contact hole through which the static electricity shielding member and the first sacrifice electrode are connected to each other.

11. The display device of claim 9, further comprising:
    a ground electrode connected to the second sacrifice electrode.

12. The display device of claim 11, wherein:
    the gate insulating 1ayer includes a second contact hole through which the second sacrifice electrode and the ground electrode are connected to each other.

13. The display device of claim 11, wherein:
    the ground electrode is applied with a constant potential voltage.

14. The display device of claim 1,
    further comprising a buffer layer arranged on the substrate, the static electricity shielding member being interposed between the substrate and the buffer layer and spacing apart portions of the buffer layer from the substrate.

15. The display device of claim 1, further comprising:
    an organic light emitting diode connected to the thin film transistor.

16. The display device of claim 1, the first sacrifice electrode being only connected to the static electricity shielding member.

17. A display device, comprising:
    a substrate;
    a static electricity shielding member formed on the substrate;
    a buffer layer formed on the static electricity shielding member;
    at least one thin film transistor formed on the buffer layer, the thin film transistor comprising a semiconductor layer which is disposed wholly within a boundary of the static electricity shielding member; and
    a sacrifice capacitor comprising a first sacrifice electrode connected to the static electricity shielding, member and a second sacrifice electrode connected to a ground.

18. The display device of claim 17, wherein the buffer layer comprises silicon nitride, the static electricity shielding member being interposed between the substrate and the buffer layer and spacing apart portions of the buffer layer from the substrate.

19. The display device of claim 17, wherein the static electricity shielding member comprises at least one of metal, polysilicon, and oxide semiconductor.

20. The display device of claim 17, the first sacrifice electrode being only connected to the static electricity shielding member.

* * * * *